United States Patent
Howard et al.

(10) Patent No.: US 11,437,697 B2
(45) Date of Patent: Sep. 6, 2022

(54) NON-MONOTONIC RE-ENTRANT BAND STOP FILTER EQUALIZER

(71) Applicant: John Howard, Upper Mount Bethel, PA (US)

(72) Inventors: Wenny Howard, Upper Mount Bethel, PA (US); John Howard, Upper Mount Bethel, PA (US)

(73) Assignee: John Howard, Upper Mount Bethel, PA (US)

( * ) Notice: Subject to any disclaimer, the term of this patent is extended or adjusted under 35 U.S.C. 154(b) by 63 days.

(21) Appl. No.: 16/990,678

(22) Filed: Aug. 11, 2020

(65) Prior Publication Data

US 2021/0058052 A1 Feb. 25, 2021

Related U.S. Application Data

(60) Provisional application No. 62/891,219, filed on Aug. 23, 2019.

(51) Int. Cl.
*H01P 5/18* (2006.01)
*H03H 7/01* (2006.01)

(52) U.S. Cl.
CPC .......... *H01P 5/184* (2013.01); *H03H 7/0153* (2013.01); *H03H 2007/013* (2013.01)

(58) Field of Classification Search
CPC .......... H03H 2007/0013; H03H 7/061; H03H 7/0153; H01P 5/18; H01P 5/185
USPC .......................................... 333/109, 116, 176
See application file for complete search history.

(56) References Cited

U.S. PATENT DOCUMENTS

| 4,394,630 A * | 7/1983 | Kenyon | H01P 5/187 333/116 |
| 2010/0007438 A1* | 1/2010 | Lee | H03H 7/075 333/176 |
| 2019/0267956 A1* | 8/2019 | Granger-Jones | H04B 1/0475 |

* cited by examiner

*Primary Examiner* — Rakesh B Patel
(74) *Attorney, Agent, or Firm* — FisherBroyles, LLP

(57) ABSTRACT

A non-monotonic re-entrant band stop filter equalizer includes terminations and couplers. A first port of a first coupler is coupled as a first external port, and a second port of the first coupler is coupled to a band stop filter. A third port of the first coupler is coupled to a fourth port of a second coupler, and a fourth port of the first coupler is coupled to a first termination. A first port of the second coupler is coupled to the band stop filter, and a second port of the second coupler is coupled as a second external port. A third port of the second coupler is coupled to a second termination. At least one of the first directional coupler and/or second directional coupler may include at least one of a backward coupler and/or forward coupler.

22 Claims, 3 Drawing Sheets

NON-MONOTONIC RE-ENTRANT BAND STOP FILTER EQUALIZER

CROSS-REFERENCE TO RELATED APPLICATION

This application claims the benefit of, and priority to, U.S. Provisional Application No. 62/891,219, filed Aug. 23, 2019, the disclosure of which is incorporated herein by reference in its entirety.

BACKGROUND

Field

The disclosed subject matter generally relates to electromagnetic wave filters and, more particularly, relates to band stop filter equalization.

Related Art

Band stop filters exhibit stop band attenuation that changes monotonically. However, this characteristic is often undesirable in certain applications.

SUMMARY

Various embodiments of the subject matter disclosed herein relate to a non-monotonic re-entrant band stop filter equalizer, which includes a first termination, a second termination, a first directional coupler, and a second directional coupler. The first directional coupler includes a first port, a second port, a third port, and a fourth port. The second directional coupler includes a first port, a second port, a third port, and a fourth por. The first port of the first directional coupler is configured to be operably coupled as a first external port, and the second port of the first directional coupler is configured to be operably coupled to a band stop filter. The third port of the first directional coupler is configured to be operably coupled to the fourth port of the second directional coupler, and the fourth port of the first directional coupler is configured to be operably coupled to the first termination. The first port of the second directional coupler is configured to be operably coupled to the band stop filter, and the second port of the second directional coupler is configured to be operably coupled as a second external port. The third port of the second directional coupler is configured to be operably coupled to the second termination.

At least one of the first termination and the second termination may include ground, and at least one of the first directional coupler and the second directional coupler may include an end coupler. At least one of the first directional coupler and the second directional coupler may include a direct coupled power dividing structure, and at least one of the first directional coupler and the second directional coupler may include a direct power dividing structure. At least one of the first directional coupler and the second directional coupler may include a coupled power dividing structure, and at least one of the first directional coupler and the second directional coupler may include a pair of coupled transmission lines. The pair of coupled transmission lines may be implemented using at least one of coaxial technology and planar technology, and the pair of coupled transmission lines may be implemented using at least one of strip line technology and microstrip technology. Power on the pair of coupled transmission lines may flow in opposite directions. At least one of the first directional coupler and/or second directional coupler may include at least one of a backward coupler and/or forward coupler.

Various embodiments of the subject matter disclosed herein relate to a method of non-monotonic re-entrant band stop filter equalization, which includes coupling a first port of a first directional coupler operably as a first external port, coupling a second port of the first directional coupler operably to a band stop filter, coupling a third port of the first directional coupler operably to a fourth port of a second directional coupler, coupling a fourth port of the first directional coupler operably to a first termination, coupling a first port of the second directional coupler operably to the band stop filter, coupling a second port of the second directional coupler operably as a second external port, and coupling a third port of the second directional coupler operably to a second termination.

The method of non-monotonic re-entrant band stop filter equalization may include coupling at least one of the first termination and the second termination to ground, and at least one of the first directional coupler and the second directional coupler may include an end coupler. At least one of the first directional coupler and the second directional coupler may include a direct coupled power dividing structure, and at least one of the first directional coupler and the second directional coupler may include a direct power dividing structure. At least one of the first directional coupler and the second directional coupler may include a coupled power dividing structure, and at least one of the first directional coupler and the second directional coupler may include a pair of coupled transmission lines. The method of non-monotonic re-entrant band stop filter equalization may include implementing the pair of coupled transmission lines using at least one of coaxial technology and planar technology, the method may include implementing the pair of coupled transmission lines using at least one of strip line technology and microstrip technology. Power on the pair of coupled transmission lines may flow in opposite directions. At least one of the first directional coupler and/or second directional coupler may include at least one of a backward coupler and/or forward coupler.

Additional embodiments will become apparent from the following detailed description considered in conjunction with the accompanying drawings. It is to be understood, however, that the drawings are designed as an illustration only and not as a definition of the limits of any of the embodiments.

BRIEF DESCRIPTION OF THE DRAWINGS

The following drawings are provided by way of example only and without limitation, wherein like reference numerals (when used) indicate corresponding elements throughout the several views, and wherein.

It is to be appreciated that elements in the figures are illustrated for simplicity and clarity. Common but well-understood elements that are useful or necessary in a commercially feasible embodiment are not shown in order to facilitate a less hindered view of the illustrated embodiments.

DETAILED DESCRIPTION

Figure 1A:
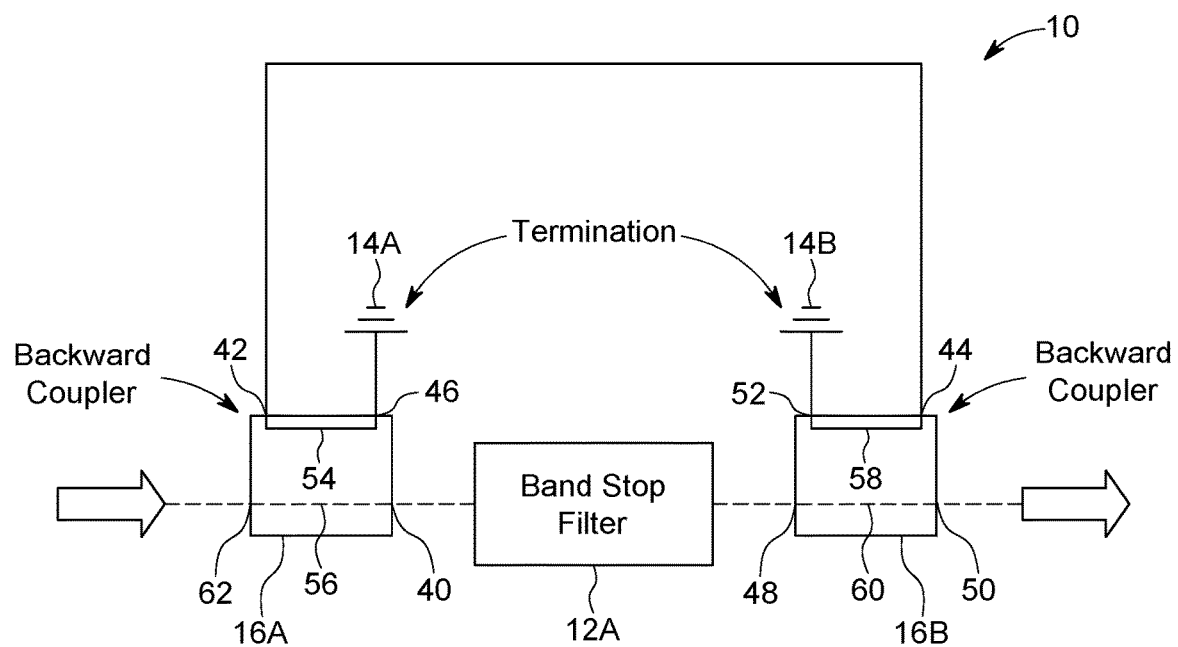
FIG. 1a shows a block diagram of a first embodiment of a non-monotonic re-entrant band stop filter equalizer, which is formed in accordance with one or more of the disclosed embodiments.

FIG. 1a shows a block diagram of a first embodiment of a non-monotonic re-entrant band stop filter equalizer 10, which is formed in accordance with one or more of the disclosed embodiments and used with a first band stop filter 12A. The non-monotonic re-entrant band stop filter equalizer 10 includes a plurality of terminations 14A, 14B and a plurality of backward couplers 16A, 16B. The terminations are operatively coupled to ground.

A first port 62 of a first backward coupler 16A is configured to be operably coupled as a first external port, and a second port 40 of the first backward coupler 16A is configured to be operably coupled to the band stop filter 12A. A third port 42 of the first backward coupler 16A is configured to be operably coupled to a fourth port 44 of a second backward coupler 16B, and a fourth port 46 of the first backward coupler 16A is configured to be operably coupled to a first termination 14A. A first port 48 of a second backward coupler 16B is configured to be operably coupled to the first band stop filter 12A, and a second port 50 of the second backward coupler 16B is configured to be operably coupled as a second external port. A third port 52 of the second backward coupler 16B is configured to be operably coupled to a second termination 14B.

Figure 1B:
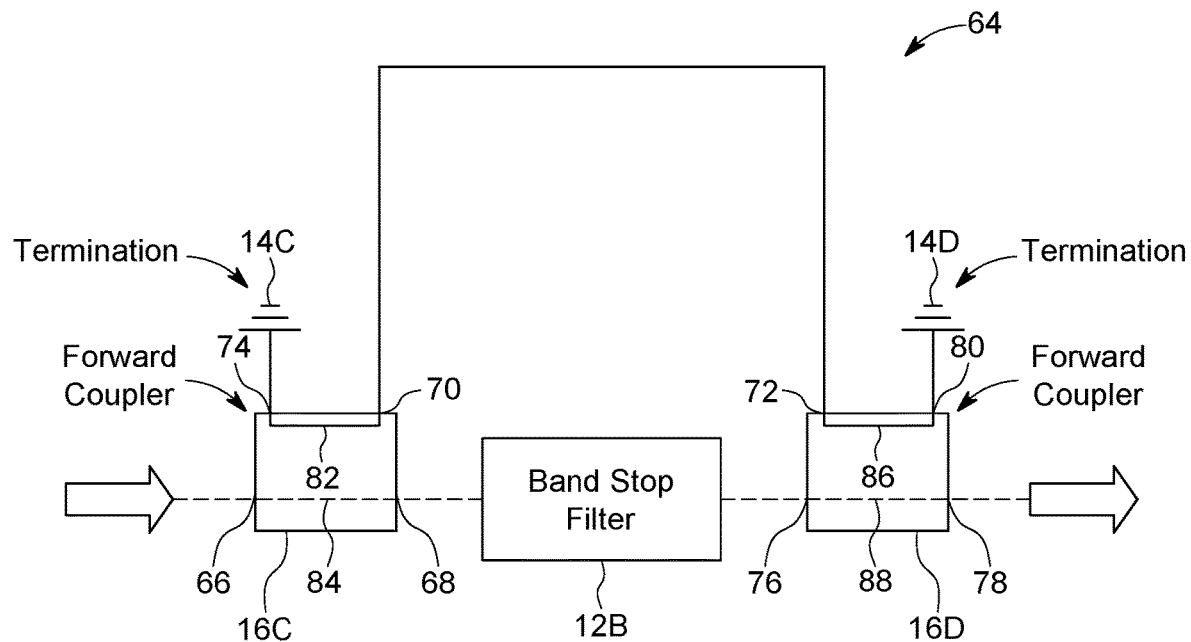
FIG. 1b shows a block diagram of a second embodiment of the non-monotonic re-entrant band stop filter equalizer, which is formed in accordance with one or more of the disclosed embodiments.

FIG. 1b shows a block diagram of a second embodiment of the non-monotonic re-entrant band stop filter equalizer 64, which is formed in accordance with one or more of the disclosed embodiments and used with a second band stop filter 12B. The non-monotonic re-entrant band stop filter equalizer 64 includes a plurality of terminations 14C, 14D and a plurality of forward couplers 16C, 16D. The terminations are operatively coupled to ground.

A first port 66 of a first forward coupler 16C is configured to be operably coupled as a third external port, and a second port 68 of the first forward coupler 16c is configured to be operably coupled to a second band stop filter 12B. A third port 70 of the first forward coupler 16C is configured to be operably coupled to a fourth port 72 of a second forward coupler 16D, and a fourth port 74 of the first forward coupler 16C is configured to be operably coupled to a third termination 14C. A first port 76 of the second forward coupler 16D is configured to be operably coupled to the second band stop filter 12B, and a second port 78 of the second forward coupler 16D is configured to be operably coupled as a second external port. A third port 80 of the second forward coupler 16D is configured to be operably coupled to a fourth termination 14D.

The directional couplers are four-port circuits, in which one port is isolated from the input port, and are passive reciprocal networks. Each of the ports is ideally matched, and the circuit is ideally lossless. The directional couplers can be realized using microstrip, strip line, coax, and/or waveguide techniques. The directional couplers are used for sampling a signal, sometimes both the incident and reflected waves, and use the distributed properties of microwave circuits. The coupling process occurs within a quarter-wavelength or multiple quarter-wavelength portions of the device. In these distributed couplers, the energy and fields of one structure interact with the energy and fields of another distributed structure, thereby coupling signals from one to another.

The directional coupler include four ports. One port is regarded as the input; another port is regarded as a through port, through which most of the incident signal exits; another port is regarded as a coupled port, through which a fixed fraction of the input signal appears that is expressed in decibels; and another port is regarded as an isolated port, which is terminated.

One form of directional coupler includes a pair of coupled transmission lines. These transmission lines may be realized or implemented using a variety of technologies including coaxial and planar technologies, such as strip line and microstrip. For example, with reference to the backward coupler 16A shown in FIG. 1a, power on a coupled line 54 flows in an opposite direction to power on a main line 56. Similarly, with reference to the backward coupler 16B shown in FIG. 1a, power on a coupled line 58 flows in an opposite direction to power on a main line 60. For this reason, these devices are referred to as backward couplers.

In the forward coupler 16C-D, energy that propagates down a transmission line starts a parallel wave in the same direction down an adjacent transmission line. For example, with reference to the forward coupler 16C shown in FIG. 1b, power on a coupled line 82 flows in the same direction to power on a main line 84. Similarly, with reference to the forward coupler 16D shown in FIG. 1b, power on a coupled line 86 flows in the same direction to power on a main line 88. For this reason, these devices are referred to as forward couplers.

Figure 2:
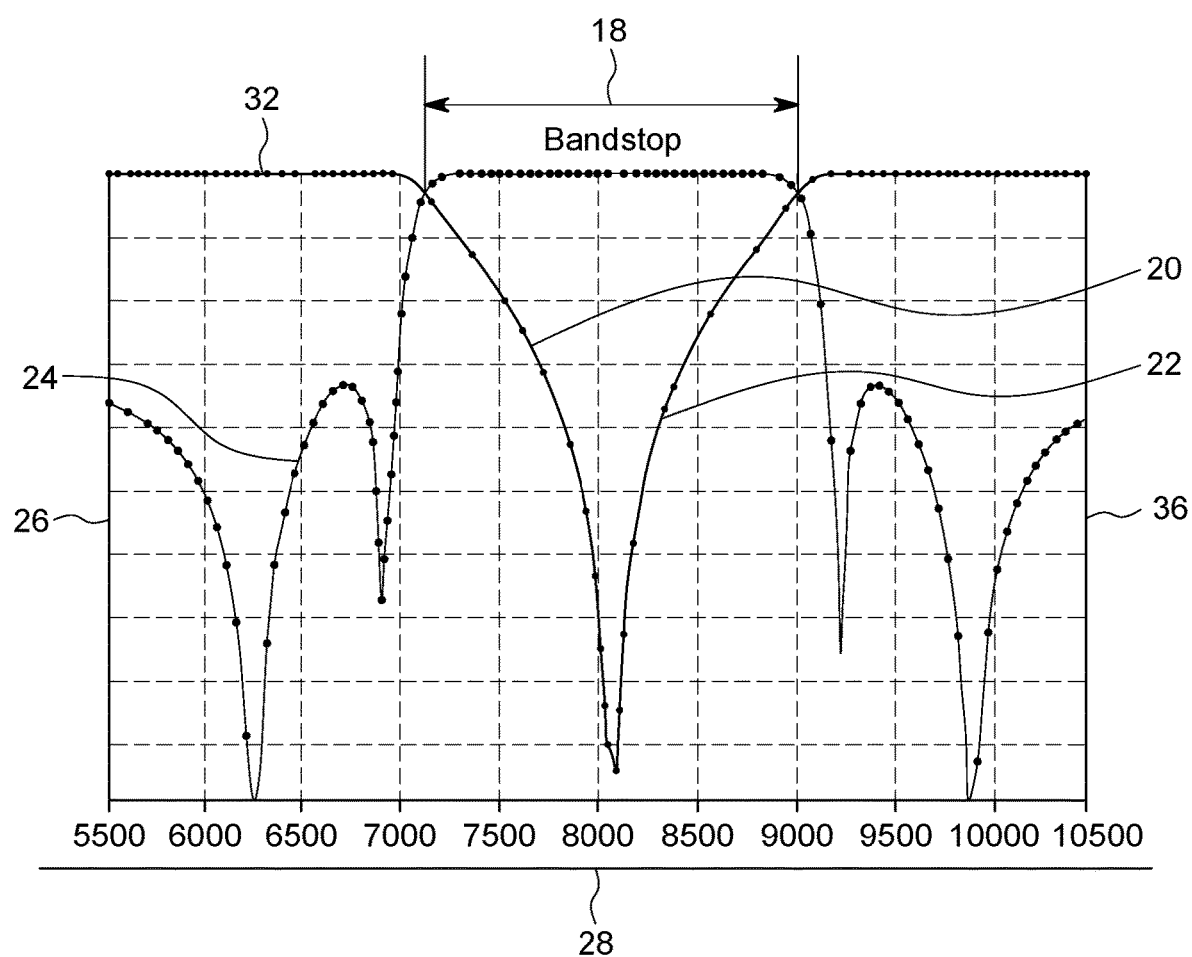
FIG. 2 shows a band stop filter response graph.
Figure 3:
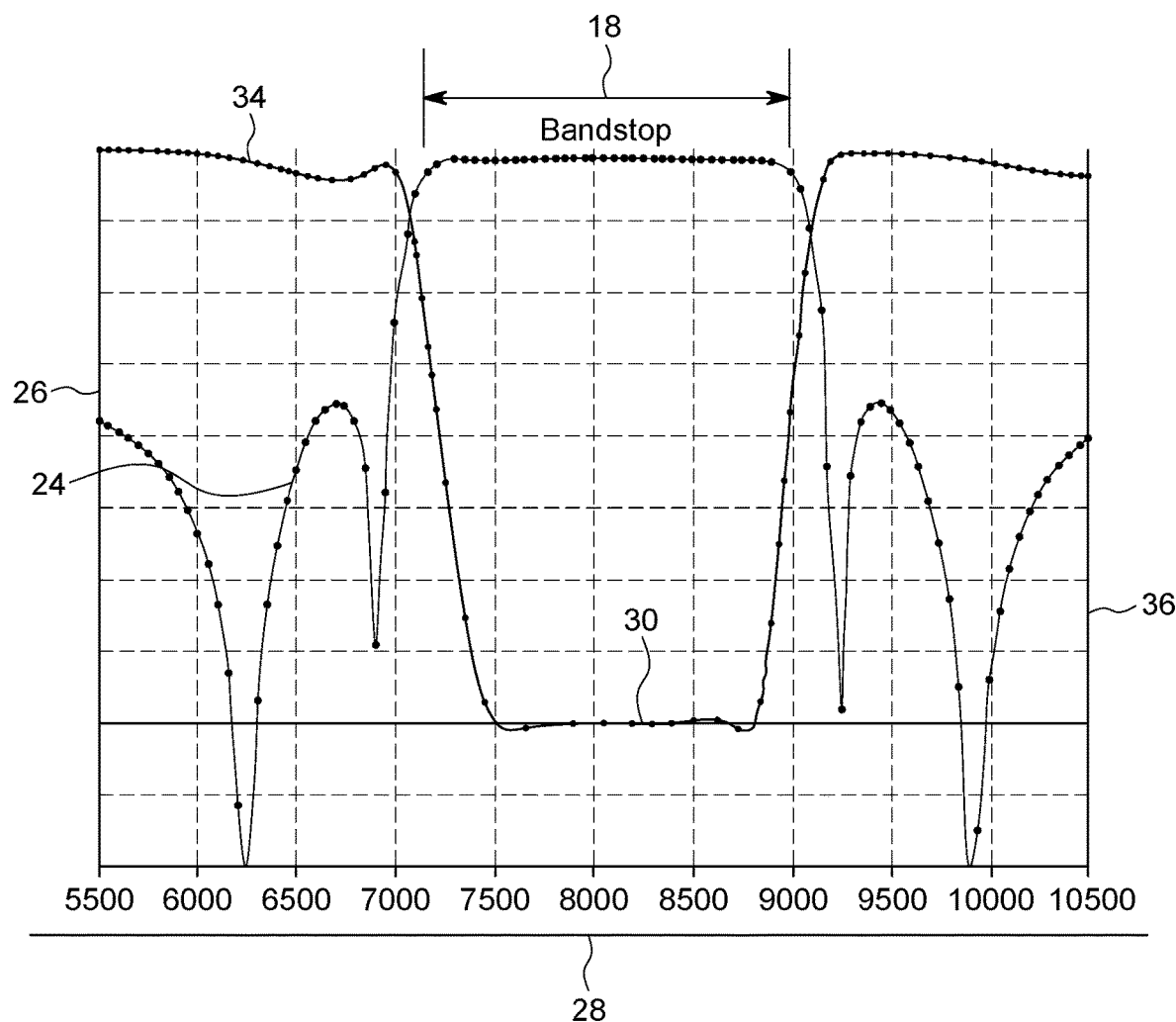
FIG. 3 shows a band stop filter response graph of the non-monotonic re-entrant band stop filter equalizer shown in FIG. 1, which displays a filter equalized attenuation response with a portion of a stop band.

FIGS. 2 and 3 show a filter response graph 24 of the band stop filter 12A shown in FIG. 1, which represents gain on a vertical axis 26 as a function of frequency on a horizontal axis 28. As is also shown in FIG. 2, the band stop filter 12A, when used without the non-monotonic re-entrant band stop filter equalizer 10 shown in FIG. 1, exhibits attenuation. This attenuation is quantified on a vertical axis 36 as a function of frequency quantified on the horizontal axis 28. Within a stop band 18 associated with the band stop filter 12A, the attenuation changes monotonically as a function of frequency at portions 20, 22 of an attenuation graph 32.

It is advantageous, particularly in signal processing applications, to provide a substantially constant attenuation during at least a portion 30 of the stop band 18, as shown by an attenuation graph 34 in FIG. 3, by equalizing attenuation across the stop band 18. The attenuation graph 34 illustrates the attenuation quantified on the vertical axis 36 as a function of frequency quantified on the horizontal axis 28, exhibited when the band stop filter 12A is used with the non-monotonic re-entrant band stop filter equalizer 10, as shown in FIG. 1. The non-monotonic re-entrant band stop filter equalizer 10 provides this equalization of attenuation such that the substantially constant attenuation is achieved during at least a portion 30 of the attenuation graph 34 during the stop band 18, as shown in FIG. 3.

It is to be noted that any type of coupler structure, such as, but not limited to, an end coupler and/or any direct or coupled power dividing structure, can be substituted for the backward and/or forward couplers in the embodiments disclosed herein while remaining within the intended scope of the invention. It is to be further noted that the backward and/or forward coupler can be very broad band.

Although the specification describes components and functions implemented in the embodiments with reference to particular standards and protocols, the embodiment are not limited to such standards and protocols.

The illustrations of embodiments described herein are intended to provide a general understanding of the structure of various embodiments, and the embodiments are not intended to serve as a complete description of all the elements and features of apparatus and systems that might make use of the structures described herein. Many other embodiments will be apparent to those skilled in the art upon reviewing the above description. Other embodiments are utilized and derived therefrom, such that structural and logical substitutions and changes are made without departing from the scope of this disclosure. Figures are also merely representational and are not drawn to scale. Certain proportions thereof are exaggerated, while others are decreased. Accordingly, the specification and drawings are to be regarded in an illustrative rather than a restrictive sense.

Such embodiments are referred to herein, individually and/or collectively, by the term "embodiment" merely for convenience and without intending to voluntarily limit the scope of this application to any single embodiment or inventive concept if more than one is in fact shown. Thus, although specific embodiments have been illustrated and described herein, it should be appreciated that any arrangement calculated to achieve the same purpose are substituted for the specific embodiments shown. This disclosure is intended to cover any and all adaptations or variations of various embodiments. Combinations of the above embodiments, and other embodiments not specifically described herein, will be apparent to those skilled in the art upon reviewing the above description.

In the foregoing description of the embodiments, various features are grouped together in a single embodiment for the purpose of streamlining the disclosure. This method of disclosure is not to be interpreted as reflecting that the claimed embodiments have more features than are expressly recited in each claim. Rather, as the following claims reflect, inventive subject matter lies in less than all features of a single embodiment. Thus, the following claims are hereby incorporated into the detailed description, with each claim standing on its own as a separate example embodiment.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single embodiment. Thus, the following claims are hereby incorporated into the Detailed Description, with each claim standing on its own as separately claimed subject matter.

Although specific example embodiments have been described, it will be evident that various modifications and changes are made to these embodiments without departing from the broader scope of the inventive subject matter described herein. Accordingly, the specification and drawings are to be regarded in an illustrative rather than a restrictive sense. The accompanying drawings that form a part hereof, show by way of illustration, and without limitation, specific embodiments in which the subject matter are practiced. The embodiments illustrated are described in sufficient detail to enable those skilled in the art to practice the teachings herein. Other embodiments are utilized and derived therefrom, such that structural and logical substitutions and changes are made without departing from the scope of this disclosure. This Detailed Description, therefore, is not to be taken in a limiting sense, and the scope of various embodiments is defined only by the appended claims, along with the full range of equivalents to which such claims are entitled.

Given the teachings provided herein, one of ordinary skill in the art will be able to contemplate other implementations and applications of the techniques of the disclosed embodiments. Although illustrative embodiments have been described herein with reference to the accompanying drawings, it is to be understood that these embodiments are not limited to the disclosed embodiments, and that various other changes and modifications are made therein by one skilled in the art without departing from the scope of the appended claims.

What is claimed is:

1. A non-monotonic re-entrant band stop filter equalizer, which comprises:
    a first termination;
    a second termination;
    a first directional coupler, the first directional coupler comprising a first port, a second port, a third port, and a fourth port; and
    a second directional coupler, the second directional coupler comprising a first port, a second port, a third port, and a fourth port, the first port of the first directional coupler being configured to be operably coupled as a first external port, the second port of the first directional coupler being configured to be operably coupled to a band stop filter, the third port of the first directional coupler being configured to be operably coupled to the fourth port of the second directional coupler, the fourth port of the first directional coupler being configured to be operably coupled to the first termination, the first port of the second directional coupler being configured to be operably coupled to the band stop filter, the second port of the second directional coupler being configured to be operably coupled as a second external port, the third port of the second directional coupler being configured to be operably coupled to the second termination, the first and second ports of the first directional coupler being connected to a first main transmission line, the third and fourth ports of the first directional coupler being connected to a first coupled transmission line; the first main and first coupled transmission lines of the first directional coupler being unconnected, the first and second ports of the second directional coupler being connected to a second main transmission line, the third and fourth ports of the second directional coupler being connected to a second coupled transmission line; the second main and second coupled transmission lines of the second directional coupler being unconnected.

2. The non-monotonic re-entrant band stop filter equalizer, as defined by claim 1, wherein at least one of the first termination and the second termination comprises ground.

3. The non-monotonic re-entrant band stop filter equalizer, as defined by claim 1, wherein at least one of the first directional coupler and the second directional coupler comprises an end directional coupler.

4. The non-monotonic re-entrant band stop filter equalizer, as defined by claim 1, wherein at least one of the first directional coupler and the second directional coupler comprises a direct coupled power dividing structure.

5. The non-monotonic re-entrant band stop filter equalizer, as defined by claim 1, wherein at least one of the first directional coupler and the second directional coupler comprises a direct power dividing structure.

6. The non-monotonic re-entrant band stop filter equalizer, as defined by claim 1, wherein at least one of the first directional coupler and the second directional coupler comprises a coupled power dividing structure.

7. The non-monotonic re-entrant band stop filter equalizer, as defined by claim 1, wherein the first main transmission line and the first coupled transmission line form a pair of coupled transmission lines of the first directional coupler, and wherein the second main transmission line and the second coupled transmission line form a pair of coupled transmission lines of the second directional coupler.

8. The non-monotonic re-entrant band stop filter equalizer, as defined by claim 7, wherein at least one of the pair of coupled transmission lines is implemented using at least one of coaxial technology and planar technology.

9. The non-monotonic re-entrant band stop filter equalizer, as defined by claim 7, wherein at least one of the pair of coupled transmission lines is implemented using at least one of strip line technology and microstrip technology.

10. The non-monotonic re-entrant band stop filter equalizer, as defined by claim 7, wherein power on at least one of the pair of coupled transmission lines flows in opposite directions.

11. The non-monotonic re-entrant band stop filter equalizer, as defined by claim 1, wherein at least one of the first coupler and the second coupler comprises at least one of a backward coupler and a forward coupler.

12. A method of non-monotonic re-entrant band stop filter equalization, which comprises:
coupling a first port of a first directional coupler operably as a first external port;
coupling a second port of the first directional coupler operably to a band stop filter;
coupling a third port of the first directional coupler operably to a fourth port of a second directional coupler;
coupling a fourth port of the first directional coupler operably to a first termination;
coupling a first port of the second directional coupler operably to the band stop filter;
coupling a second port of the second directional coupler operably as a second external port;
coupling a third port of the second directional coupler operably to a second termination, the first and second ports of the first directional coupler being connected to a first main transmission line, the third and fourth ports of the first directional coupler being connected to a first coupled transmission line; the first main and first coupled transmission lines of the first directional coupler being unconnected, the first and second ports of the second directional coupler being connected to a second main transmission line, the third and fourth ports of the second directional coupler being connected to a second coupled transmission line; the second main and second coupled transmission lines of the second directional coupler being unconnected.

13. The method of non-monotonic re-entrant band stop filter equalization, as defined by claim 12, wherein at least one of the first coupler and the second coupler comprises at least one of a backward coupler and a forward coupler.

14. The method of non-monotonic re-entrant band stop filter equalization, as defined by claim 12, wherein at least one of the first directional coupler and the second directional coupler comprises a direct coupled power dividing structure.

15. The method of non-monotonic re-entrant band stop filter equalization, as defined by claim 12, wherein at least one of the first directional coupler and the second directional coupler comprises a direct power dividing structure.

16. The method of non-monotonic re-entrant band stop filter equalization, as defined by claim 12, wherein at least one of the first directional coupler and the second directional coupler comprises a coupled power dividing structure.

17. The method of non-monotonic re-entrant band stop filter equalization, as defined by claim 12, wherein the first main transmission line and the first coupled transmission line form a pair of coupled transmission lines of the first directional coupler, and wherein the second main transmission line and the second coupled transmission line form a pair of coupled transmission lines of the second directional coupler.

18. The method of non-monotonic re-entrant band stop filter equalization, as defined by claim 17, further comprising implementing at least one of the pair of coupled transmission lines using at least one of coaxial technology and planar technology.

19. The method of non-monotonic re-entrant band stop filter equalization, as defined by claim 17, further comprising implementing at least one of the pair of coupled transmission lines using at least one of strip line technology and microstrip technology.

20. The method of non-monotonic re-entrant band stop filter equalization, as defined by claim 7, wherein power on at least one of the pair of coupled transmission lines flows in opposite directions.

21. The method of non-monotonic re-entrant band stop filter equalization, as defined by claim 12, further comprising coupling at least one of the first termination and the second termination to ground.

22. The method of non-monotonic re-entrant band stop filter equalization, as defined by claim 12, wherein at least one of the first directional coupler and the second directional coupler comprises an end directional coupler.

\* \* \* \* \*